US011150903B2

(12) United States Patent
Shu et al.

(10) Patent No.: US 11,150,903 B2
(45) Date of Patent: *Oct. 19, 2021

(54) COMPUTATIONAL MEMORY CELL AND PROCESSING ARRAY DEVICE USING MEMORY CELLS

(71) Applicant: GSI TECHNOLOGY, INC., Sunnyvale, CA (US)

(72) Inventors: Lee-Lean Shu, Sunnyvale, CA (US); Chao-Hung Chang, Sunnyvale, CA (US); Avidan Akerib, Sunnyvale, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,980

(22) Filed: Jun. 8, 2020

(65) Prior Publication Data
US 2020/0301707 A1    Sep. 24, 2020

Related U.S. Application Data

(63) Continuation of application No. 15/709,379, filed on Sep. 19, 2017, now Pat. No. 10,521,229, and a continuation of application No. 15/709,382, filed on Sep. 19, 2017, now Pat. No. 10,725,777, and a
(Continued)

(51) Int. Cl.
| | |
|---|---|
| *G11C 11/00* | (2006.01) |
| *G06F 9/30* | (2018.01) |
| *G11C 11/412* | (2006.01) |
| *G06F 15/78* | (2006.01) |

(Continued)

(52) U.S. Cl.
CPC ...... *G06F 9/30043* (2013.01); *G06F 9/30029* (2013.01); *G06F 15/785* (2013.01); *G11C 11/412* (2013.01); *G11C 11/418* (2013.01); *G11C 11/419* (2013.01)

(58) Field of Classification Search
USPC .......................................... 712/220; 365/154
See application file for complete search history.

(56) References Cited

U.S. PATENT DOCUMENTS

| | | | |
|---|---|---|---|
| 3,451,694 | A | 6/1969 | Hass |
| 3,747,952 | A | 7/1973 | Graebe |
| 3,795,412 | A | 3/1974 | John |

(Continued)

FOREIGN PATENT DOCUMENTS

| | | |
|---|---|---|
| CN | 104752431 B | 1/2019 |
| DE | 10133281 A1 | 1/2002 |
| JP | 2005346922 A | 12/2005 |

OTHER PUBLICATIONS

US 10,564,982 B1, 02/2020, Oh et al. (withdrawn)
(Continued)

*Primary Examiner* — Viet Q Nguyen
(74) *Attorney, Agent, or Firm* — DLA Piper LLP (US)

(57) ABSTRACT

A memory cell that may be used for computation and processing array using the memory cell are capable to performing a logic operation including a boolean AND, a boolean OR, a boolean NAND or a boolean NOR. The memory cell may have a read port that has isolation circuits that isolate the data stored in the storage cell of the memory cell from the read bit line.

8 Claims, 10 Drawing Sheets

Related U.S. Application Data continuation of application No. 15/709,385, filed on Sep. 19, 2017, now Pat. No. 10,860,318.

(60) Provisional application No. 62/430,762, filed on Dec. 6, 2016.

(51) Int. Cl.
  *G11C 11/419* (2006.01)
  *G11C 11/418* (2006.01)

(56) References Cited

U.S. PATENT DOCUMENTS

| | | | |
|---|---|---|---|
| 4,227,717 A | 10/1980 | Bouvier | |
| 4,308,505 A | 12/1981 | Messerschmitt | |
| 4,587,496 A | 5/1986 | Wolaver | |
| 4,594,564 A | 6/1986 | Yarborough, Jr. | |
| 4,677,394 A | 6/1987 | Vollmer | |
| 4,716,322 A | 12/1987 | D'Arrigo et al. | |
| 4,741,006 A | 4/1988 | Yamaguchi et al. | |
| 4,856,035 A | 8/1989 | Lewis | |
| 5,008,636 A | 4/1991 | Markinson | |
| 5,302,916 A | 4/1994 | Pritchett | |
| 5,375,089 A | 12/1994 | Lo | |
| 5,382,922 A | 1/1995 | Gersbach et al. | |
| 5,400,274 A | 3/1995 | Jones et al. | |
| 5,473,574 A | 12/1995 | Clemen et al. | |
| 5,530,383 A | 6/1996 | May | |
| 5,535,159 A | 7/1996 | Nii | |
| 5,563,834 A | 10/1996 | Longway et al. | |
| 5,587,672 A | 12/1996 | Ranganathan et al. | |
| 5,608,354 A | 3/1997 | Hori | |
| 5,661,419 A | 8/1997 | Bhagwan | |
| 5,696,468 A | 12/1997 | Nise | |
| 5,736,872 A | 4/1998 | Sharma et al. | |
| 5,744,979 A | 4/1998 | Goetting | |
| 5,744,991 A | 4/1998 | Jefferson et al. | |
| 5,748,044 A | 5/1998 | Xue | |
| 5,768,559 A | 6/1998 | Iino et al. | |
| 5,805,912 A | 9/1998 | Johnson et al. | |
| 5,883,853 A | 3/1999 | Zheng et al. | |
| 5,937,204 A | 8/1999 | Schinnerer | |
| 5,942,949 A | 8/1999 | Wilson et al. | |
| 5,963,059 A | 10/1999 | Partovi et al. | |
| 5,969,576 A | 10/1999 | Trodden | |
| 5,969,986 A | 10/1999 | Wong | |
| 5,977,801 A | 11/1999 | Boerstler | |
| 5,999,458 A | 12/1999 | Nishimura et al. | |
| 6,005,794 A | 12/1999 | Sheffield et al. | |
| 6,044,034 A | 3/2000 | Katakura | |
| 6,058,063 A | 5/2000 | Jang | |
| 6,072,741 A | 6/2000 | Taylor | |
| 6,100,721 A | 8/2000 | Durec et al. | |
| 6,100,736 A | 8/2000 | Wu et al. | |
| 6,114,920 A | 9/2000 | Moon et al. | |
| 6,115,320 A | 9/2000 | Mick et al. | |
| 6,133,770 A | 10/2000 | Hasegawa | |
| 6,167,487 A | 12/2000 | Camacho | |
| 6,175,282 B1 | 1/2001 | Yasuda | |
| 6,226,217 B1 | 5/2001 | Riedlinger et al. | |
| 6,262,937 B1 | 7/2001 | Arcoleo et al. | |
| 6,263,452 B1 | 7/2001 | Jewett et al. | |
| 6,265,902 B1 | 7/2001 | Klemmer et al. | |
| 6,286,077 B1 | 9/2001 | Choi et al. | |
| 6,310,880 B1 * | 10/2001 | Waller | G11C 15/04 365/189.07 |
| 6,366,524 B1 | 4/2002 | Abedifard | |
| 6,377,127 B1 | 4/2002 | Fukaishi et al. | |
| 6,381,684 B1 | 4/2002 | Hronik et al. | |
| 6,385,122 B1 | 5/2002 | Chang | |
| 6,407,642 B2 | 6/2002 | Dosho et al. | |
| 6,418,077 B1 | 7/2002 | Naven | |
| 6,441,691 B1 | 8/2002 | Jones et al. | |
| 6,448,757 B2 | 9/2002 | Hill | |
| 6,473,334 B1 | 10/2002 | Bailey et al. | |
| 6,483,361 B1 | 11/2002 | Chiu | |
| 6,504,417 B1 | 1/2003 | Cecchi et al. | |
| 6,538,475 B1 | 3/2003 | Johansen et al. | |
| 6,567,338 B1 | 5/2003 | Mick | |
| 6,594,194 B2 | 7/2003 | Gold | |
| 6,642,747 B1 | 11/2003 | Chiu | |
| 6,661,267 B2 | 12/2003 | Walker et al. | |
| 6,665,222 B2 | 12/2003 | Wright et al. | |
| 6,683,502 B1 | 1/2004 | Groen et al. | |
| 6,683,930 B1 | 1/2004 | Dalmia | |
| 6,732,247 B2 | 5/2004 | Berg et al. | |
| 6,744,277 B1 | 6/2004 | Chang et al. | |
| 6,757,854 B1 | 6/2004 | Zhao et al. | |
| 6,789,209 B1 | 9/2004 | Suzuki et al. | |
| 6,816,019 B2 | 11/2004 | Delbo' et al. | |
| 6,836,419 B2 * | 12/2004 | Loughmiller | G11C 15/04 365/149 |
| 6,838,951 B1 | 1/2005 | Nieri et al. | |
| 6,842,396 B2 | 1/2005 | Kono | |
| 6,853,696 B1 | 2/2005 | Moser et al. | |
| 6,854,059 B2 | 2/2005 | Gardner | |
| 6,856,202 B2 | 2/2005 | Lesso | |
| 6,859,107 B1 | 2/2005 | Moon et al. | |
| 6,882,237 B2 | 4/2005 | Singh et al. | |
| 6,897,696 B2 | 5/2005 | Chang et al. | |
| 6,933,789 B2 | 8/2005 | Molnar et al. | |
| 6,938,142 B2 | 8/2005 | Pawlowski | |
| 6,940,328 B2 | 9/2005 | Lin | |
| 6,954,091 B2 | 10/2005 | Wurzer | |
| 6,975,554 B1 | 12/2005 | Lapidus et al. | |
| 6,998,922 B2 | 2/2006 | Jensen et al. | |
| 7,002,404 B2 | 2/2006 | Gaggl et al. | |
| 7,002,416 B2 | 2/2006 | Pettersen et al. | |
| 7,003,065 B2 | 2/2006 | Homol et al. | |
| 7,017,090 B2 | 3/2006 | Endou et al. | |
| 7,019,569 B2 | 3/2006 | Fan-Jiang | |
| 7,042,271 B2 | 5/2006 | Chung et al. | |
| 7,042,792 B2 | 5/2006 | Lee et al. | |
| 7,042,793 B2 | 5/2006 | Masuo | |
| 7,046,093 B1 | 5/2006 | McDonagh et al. | |
| 7,047,146 B2 | 5/2006 | Chuang et al. | |
| 7,053,666 B2 | 5/2006 | Tak et al. | |
| 7,095,287 B2 | 8/2006 | Maxim et al. | |
| 7,099,643 B2 | 8/2006 | Lin | |
| 7,141,961 B2 | 11/2006 | Hirayama et al. | |
| 7,142,477 B1 | 11/2006 | Tran et al. | |
| 7,152,009 B2 | 12/2006 | Bokui et al. | |
| 7,180,816 B2 | 2/2007 | Park | |
| 7,200,713 B2 | 4/2007 | Cabot et al. | |
| 7,218,157 B2 | 5/2007 | Van De Beek et al. | |
| 7,233,214 B2 | 6/2007 | Kim et al. | |
| 7,246,215 B2 | 7/2007 | Lu et al. | |
| 7,263,152 B2 | 8/2007 | Miller et al. | |
| 7,269,402 B2 | 9/2007 | Uozumi et al. | |
| 7,282,999 B2 | 10/2007 | Da Dalt et al. | |
| 7,312,629 B2 | 12/2007 | Chuang et al. | |
| 7,313,040 B2 | 12/2007 | Chuang et al. | |
| 7,330,080 B1 | 2/2008 | Stoiber et al. | |
| 7,340,577 B1 | 3/2008 | Van Dyke et al. | |
| 7,349,515 B1 | 3/2008 | Chew et al. | |
| 7,352,249 B2 | 4/2008 | Balboni et al. | |
| 7,355,482 B2 | 4/2008 | Meltzer | |
| 7,355,907 B2 | 4/2008 | Chen et al. | |
| 7,369,000 B2 | 5/2008 | Wu et al. | |
| 7,375,593 B2 | 5/2008 | Self | |
| 7,389,457 B2 | 6/2008 | Chen et al. | |
| 7,439,816 B1 | 10/2008 | Lombaard | |
| 7,463,101 B2 | 12/2008 | Tung | |
| 7,464,282 B1 | 12/2008 | Abdollahi-Alibeik et al. | |
| 7,487,315 B2 | 2/2009 | Hur et al. | |
| 7,489,164 B2 | 2/2009 | Madurawe | |
| 7,512,033 B2 | 3/2009 | Hur et al. | |
| 7,516,385 B2 | 4/2009 | Chen et al. | |
| 7,538,623 B2 | 5/2009 | Jensen et al. | |
| 7,545,223 B2 | 6/2009 | Watanabe | |
| 7,565,480 B2 | 7/2009 | Ware et al. | |
| 7,577,225 B2 | 8/2009 | Azadet et al. | |
| 7,592,847 B2 | 9/2009 | Liu et al. | |
| 7,595,657 B2 | 9/2009 | Chuang et al. | |

(56) References Cited

U.S. PATENT DOCUMENTS

| | | | |
|---|---|---|---|
| 7,622,996 | B2 | 11/2009 | Liu |
| 7,630,230 | B2 | 12/2009 | Wong |
| 7,633,322 | B1 | 12/2009 | Zhuang et al. |
| 7,635,988 | B2 | 12/2009 | Madurawe |
| 7,646,215 | B2 | 1/2010 | Chuang et al. |
| 7,646,648 | B2 | 1/2010 | Arsovski |
| 7,659,783 | B2 | 2/2010 | Tai |
| 7,660,149 | B2 | 2/2010 | Liaw |
| 7,663,415 | B2 | 2/2010 | Chatterjee et al. |
| 7,667,678 | B2 | 2/2010 | Guttag |
| 7,675,331 | B2 | 3/2010 | Jung et al. |
| 7,719,329 | B1 | 5/2010 | Smith et al. |
| 7,719,330 | B2 | 5/2010 | Lin et al. |
| 7,728,675 | B1 | 6/2010 | Kennedy et al. |
| 7,737,743 | B1 | 6/2010 | Gao et al. |
| 7,746,181 | B1 | 6/2010 | Moyal |
| 7,746,182 | B2 | 6/2010 | Ramaswamy et al. |
| 7,750,683 | B2 | 7/2010 | Huang et al. |
| 7,760,032 | B2 | 7/2010 | Ardehali |
| 7,760,040 | B2 | 7/2010 | Zhang et al. |
| 7,760,532 | B2 | 7/2010 | Shirley et al. |
| 7,782,655 | B2 | 8/2010 | Shau |
| 7,812,644 | B2 | 10/2010 | Cha et al. |
| 7,813,161 | B2 | 10/2010 | Luthra |
| 7,830,212 | B2 | 11/2010 | Lee et al. |
| 7,839,177 | B1 | 11/2010 | Soh |
| 7,843,239 | B2 | 11/2010 | Sohn et al. |
| 7,843,721 | B1 | 11/2010 | Chou et al. |
| 7,848,725 | B2 | 12/2010 | Zolfaghari et al. |
| 7,859,919 | B2 | 12/2010 | De La Cruz, II et al. |
| 7,876,163 | B2 | 1/2011 | Hachigo |
| 7,916,554 | B2 | 3/2011 | Pawlowski |
| 7,920,409 | B1 | 4/2011 | Clark et al. |
| 7,920,665 | B1 | 4/2011 | Lombaard |
| 7,924,599 | B1 | 4/2011 | Evans, Jr. et al. |
| 7,940,088 | B1 | 5/2011 | Sampath et al. |
| 7,944,256 | B2 | 5/2011 | Masuda |
| 7,956,695 | B1 | 6/2011 | Ding et al. |
| 7,965,108 | B2 | 6/2011 | Liu et al. |
| 8,004,920 | B2 | 8/2011 | Ito et al. |
| 8,008,956 | B1 | 8/2011 | Shin et al. |
| 8,044,724 | B2 | 10/2011 | Rao et al. |
| 8,063,707 | B2 | 11/2011 | Wang |
| 8,087,690 | B2 | 1/2012 | Kim |
| 8,089,819 | B2 | 1/2012 | Noda et al. |
| 8,117,567 | B2* | 2/2012 | Arsovski ............... G11C 7/1006 716/100 |
| 8,174,332 | B1 | 5/2012 | Lombaard et al. |
| 8,218,707 | B2 | 7/2012 | Mai |
| 8,242,820 | B2 | 8/2012 | Kim |
| 8,258,831 | B1 | 9/2012 | Banai et al. |
| 8,284,593 | B2 | 10/2012 | Russell et al. |
| 8,294,502 | B2 | 10/2012 | Lewis et al. |
| 8,400,200 | B1 | 3/2013 | Kim et al. |
| 8,488,408 | B1 | 7/2013 | Shu et al. |
| 8,493,774 | B2* | 7/2013 | Kuang ................ G11C 7/1006 365/154 |
| 8,526,256 | B2* | 9/2013 | Ghosh .................. G11C 11/412 365/203 |
| 8,542,050 | B2 | 9/2013 | Chuang et al. |
| 8,575,982 | B1 | 11/2013 | Shu et al. |
| 8,593,860 | B2 | 11/2013 | Shu et al. |
| 8,625,334 | B2 | 1/2014 | Liaw |
| 8,643,418 | B2 | 2/2014 | Ma et al. |
| 8,692,621 | B2 | 4/2014 | Snowden et al. |
| 8,693,236 | B2 | 4/2014 | Shu et al. |
| 8,817,550 | B1 | 8/2014 | Oh |
| 8,837,207 | B1 | 9/2014 | Jou et al. |
| 8,885,439 | B1 | 11/2014 | Shu et al. |
| 8,971,096 | B2 | 3/2015 | Jung et al. |
| 8,982,649 | B2 | 3/2015 | Shu et al. |
| 8,995,162 | B2 | 3/2015 | Sang et al. |
| 9,018,992 | B1 | 4/2015 | Shu et al. |
| 9,030,893 | B2 | 5/2015 | Jung et al. |
| 9,053,768 | B2 | 6/2015 | Shu et al. |
| 9,059,691 | B2 | 6/2015 | Lin |
| 9,070,477 | B1 | 6/2015 | Clark |
| 9,083,356 | B1 | 7/2015 | Cheng |
| 9,093,135 | B2 | 7/2015 | Khailany et al. |
| 9,094,025 | B1 | 7/2015 | Cheng |
| 9,135,986 | B2* | 9/2015 | Shu ....................... G11C 11/418 |
| 9,142,285 | B2 | 9/2015 | Hwang et al. |
| 9,159,391 | B1 | 10/2015 | Shu et al. |
| 9,171,634 | B2 | 10/2015 | Zheng et al. |
| 9,177,646 | B2* | 11/2015 | Arsovski ........... G06F 16/90339 |
| 9,196,324 | B2 | 11/2015 | Haig et al. |
| 9,240,229 | B1 | 1/2016 | Oh et al. |
| 9,311,971 | B1 | 4/2016 | Oh |
| 9,318,174 | B1 | 4/2016 | Chuang et al. |
| 9,356,611 | B1 | 5/2016 | Shu et al. |
| 9,384,822 | B2 | 7/2016 | Shu et al. |
| 9,385,032 | B2 | 7/2016 | Shu |
| 9,396,790 | B1 | 7/2016 | Chhabra et al. |
| 9,396,795 | B1* | 7/2016 | Jeloka ............... G06F 16/90339 |
| 9,401,200 | B1 | 7/2016 | Chan et al. |
| 9,412,440 | B1 | 8/2016 | Shu et al. |
| 9,413,295 | B1 | 8/2016 | Chang |
| 9,431,079 | B1 | 8/2016 | Shu et al. |
| 9,443,575 | B2 | 9/2016 | Yabuuchi |
| 9,484,076 | B1 | 11/2016 | Shu et al. |
| 9,494,647 | B1 | 11/2016 | Chuang et al. |
| 9,552,872 | B2 | 1/2017 | Jung et al. |
| 9,608,651 | B1 | 3/2017 | Cheng |
| 9,613,670 | B2 | 4/2017 | Chuang et al. |
| 9,613,684 | B2 | 4/2017 | Shu et al. |
| 9,640,540 | B1 | 5/2017 | Liaw |
| 9,679,631 | B2 | 6/2017 | Haig et al. |
| 9,685,210 | B1 | 6/2017 | Ghosh et al. |
| 9,692,429 | B1 | 6/2017 | Chang et al. |
| 9,697,890 | B1 | 7/2017 | Wang |
| 9,722,618 | B1 | 8/2017 | Cheng |
| 9,729,159 | B1 | 8/2017 | Cheng |
| 9,789,840 | B2 | 10/2017 | Farooq et al. |
| 9,804,856 | B2 | 10/2017 | Oh et al. |
| 9,847,111 | B2 | 12/2017 | Shu et al. |
| 9,853,633 | B1 | 12/2017 | Cheng et al. |
| 9,853,634 | B2 | 12/2017 | Chang |
| 9,859,902 | B2 | 1/2018 | Chang |
| 9,916,889 | B1 | 3/2018 | Duong |
| 9,935,635 | B2 | 4/2018 | Chuang et al. |
| 9,966,118 | B2 | 5/2018 | Shu et al. |
| 10,065,594 | B2 | 9/2018 | Fukawatase et al. |
| 10,153,042 | B2* | 12/2018 | Ehrman ................ G06F 15/785 |
| 10,192,592 | B2 | 1/2019 | Shu et al. |
| 10,249,312 | B2* | 4/2019 | Kim ..................... H04S 3/02 |
| 10,249,362 | B2* | 4/2019 | Shu ..................... G11C 7/18 |
| 10,388,364 | B2 | 8/2019 | Ishizu et al. |
| 10,425,070 | B2 | 9/2019 | Chen et al. |
| 10,521,229 | B2* | 12/2019 | Shu ....................... G11C 11/419 |
| 10,535,381 | B2 | 1/2020 | Shu et al. |
| 10,659,058 | B1 | 5/2020 | Cheng et al. |
| 10,673,440 | B1* | 6/2020 | Camarota .......... H03K 19/1776 |
| 10,770,133 | B1* | 9/2020 | Haig ..................... G11C 11/418 |
| 10,777,262 | B1* | 9/2020 | Haig ..................... G11C 11/418 |
| 10,847,212 | B1 | 11/2020 | Haig et al. |
| 10,847,213 | B1 | 11/2020 | Haig et al. |
| 10,854,284 | B1 | 12/2020 | Chuang et al. |
| 10,860,320 | B1 | 12/2020 | Haig et al. |
| 10,877,731 | B1 | 12/2020 | Shu et al. |
| 10,891,076 | B1 | 1/2021 | Haig et al. |
| 10,930,341 | B1 | 2/2021 | Shu et al. |
| 10,943,648 | B1 | 3/2021 | Shu et al. |
| 2001/0052822 | A1 | 12/2001 | Kim et al. |
| 2002/0006072 | A1 | 1/2002 | Kunikiyo |
| 2002/0060938 | A1 | 5/2002 | Song et al. |
| 2002/0136074 | A1 | 9/2002 | Hanzawa et al. |
| 2002/0154565 | A1 | 10/2002 | Noh et al. |
| 2002/0168935 | A1 | 11/2002 | Han |
| 2003/0016689 | A1 | 1/2003 | Hoof |
| 2003/0107913 | A1 | 6/2003 | Nii |
| 2003/0185329 | A1 | 10/2003 | Dickmann |
| 2004/0053510 | A1 | 3/2004 | Little et al. |
| 2004/0062138 | A1 | 4/2004 | Partsch et al. |
| 2004/0090413 | A1 | 5/2004 | Yoo |

(56) References Cited

U.S. PATENT DOCUMENTS

| | | |
|---|---|---|
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 | 12/2004 | Wordeman et al. |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda et al. |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda et al. |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki et al. |
| 2007/0171713 A1 | 7/2007 | Hunter et al. |
| 2007/0189101 A1 | 8/2007 | Lambrache et al. |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1 | 4/2008 | Liaw |
| 2008/0117707 A1 | 5/2008 | Manickavasakam et al. |
| 2008/0129402 A1 | 6/2008 | Han et al. |
| 2008/0155362 A1 | 6/2008 | Chang et al. |
| 2008/0175039 A1 | 7/2008 | Thomas et al. |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1 | 4/2009 | Hirose et al. |
| 2009/0103390 A1 | 4/2009 | Kim et al. |
| 2009/0141566 A1 | 6/2009 | Arsovski |
| 2009/0154257 A1 | 6/2009 | Fukaishi et al. |
| 2009/0161468 A1 | 6/2009 | Fujioka |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0020590 A1 | 1/2010 | Hsueh et al. |
| 2010/0085086 A1 | 4/2010 | Nedovic et al. |
| 2010/0157715 A1 | 6/2010 | Pyeon |
| 2010/0169675 A1 | 7/2010 | Kajihara |
| 2010/0172190 A1 | 7/2010 | Lavi et al. |
| 2010/0177571 A1 | 7/2010 | Shori et al. |
| 2010/0214815 A1 | 8/2010 | Tam et al. |
| 2010/0232202 A1 | 9/2010 | Lu et al. |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ishikura et al. |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi et al. |
| 2012/0153999 A1 | 6/2012 | Kim |
| 2012/0212996 A1 | 8/2012 | Rao et al. |
| 2012/0242382 A1 | 9/2012 | Tsuchiya et al. |
| 2012/0243347 A1 | 9/2012 | Sampigethaya et al. |
| 2012/0250440 A1 | 10/2012 | Wu |
| 2012/0281459 A1 | 11/2012 | Teman et al. |
| 2012/0327704 A1 | 12/2012 | Chan et al. |
| 2013/0039131 A1 | 2/2013 | Haig et al. |
| 2013/0083591 A1 | 4/2013 | Wuu et al. |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar et al. |
| 2015/0003148 A1 | 1/2015 | Iyer et al. |
| 2015/0029782 A1 | 1/2015 | Jung et al. |
| 2015/0063052 A1 | 3/2015 | Manning |
| 2015/0187763 A1 | 7/2015 | Kim et al. |
| 2015/0213858 A1 | 7/2015 | Tao et al. |
| 2015/0248927 A1 | 9/2015 | Fujiwara et al. |
| 2015/0279453 A1 | 10/2015 | Fujiwara et al. |
| 2015/0302917 A1 | 10/2015 | Grover et al. |
| 2015/0310901 A1 | 10/2015 | Jung et al. |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder et al. |
| 2016/0141023 A1 | 5/2016 | Jung et al. |
| 2016/0225436 A1 | 8/2016 | Wang et al. |
| 2016/0225437 A1 | 8/2016 | Kumar et al. |
| 2016/0247559 A1 | 8/2016 | Atallah et al. |
| 2016/0254045 A1 | 9/2016 | Mazumder et al. |
| 2016/0284392 A1 | 9/2016 | Block et al. |
| 2016/0329092 A1 | 11/2016 | Akerib |
| 2017/0194046 A1 | 7/2017 | Yeung, Jr. et al. |
| 2017/0345505 A1 | 11/2017 | Noel et al. |
| 2018/0122456 A1 | 5/2018 | Li et al. |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1 | 6/2018 | Shu et al. |
| 2020/0117398 A1 | 4/2020 | Haig et al. |
| 2020/0160905 A1 | 5/2020 | Charles et al. |
| 2020/0403616 A1 | 12/2020 | Shu et al. |
| 2021/0027815 A1 | 1/2021 | Shu et al. |
| 2021/0027834 A1 | 1/2021 | Haig et al. |

OTHER PUBLICATIONS

Wang et al., "A Two-Write and Two-Read Multi-Port SRAM with Shared Write Bit-Line Scheme and Selective Read Path for Low Power Operation", Journal of Low Power Electronics vol. 9. 9-22, 2013, Department of Electronics Engineering and Institute of Electronics, National Chiao-Tung University, Hsinchu 300, Taiwan (Accepted: Feb. 11, 2013), 14 pages.

\* cited by examiner

| WE | WBL | WBLb | D (n) |
|---|---|---|---|
| 0 | x | x | D(n-1) |
| 1 | 0 | 1 | 0 |
| 1 | 1 | 0 | 1 |
| 1 | 0 | 0 | D(n-1) |

D(n) is storage data on the current write cycle
D(n-1) is storage data before the current write cycle

FIGURE 5

COMPUTATIONAL MEMORY CELL AND PROCESSING ARRAY DEVICE USING MEMORY CELLS

PRIORITY CLAIMS/RELATED APPLICATIONS

This application claims priority under 35 USC 120 and is a continuation of U.S. application Ser. No. 15/709,379 filed Sep. 19, 2017 (now issued as U.S. Pat. No. 10,521,229), U.S. application Ser. No. 15/709,382 filed Sep. 19, 2017 and U.S. application Ser. No. 15/709,385 filed Sep. 19, 2017, all of which claim the benefit and priority under 35 USC 119(e) and 120 to U.S. Provisional Patent Application Ser. No. 62/430,762 filed on Dec. 6, 2016 and entitled "Computational Dual Port Sram Cell And Processing Array Device Using The Dual Port Sram Cells", the entirety of all of which are incorporated herein by reference.

FIELD

The disclosure relates generally to a memory cell that may be used for computation.

BACKGROUND

An array of memory cells, such as dynamic random access memory (DRAM) cells, non-volatile memory cells, non-volatile storage devices or static random access memory (SRAM) cells or content addressable memory (CAM) cells, is a well-known mechanism used in various computer or processor based devices to store digital bits of data. The various computer and processor based devices may include computer systems, smartphone devices, consumer electronic products, televisions, internet switches and routers and the like. The array of memory cells are typically packaged in an integrated circuit or may be packaged within an integrated circuit that also has a processing device within the integrated circuit. The different types of typical memory cells have different capabilities and characteristics that distinguish each type of memory cell. For example, DRAM cells take longer to access, lose their data contents unless periodically refreshed, but are relatively cheap to manufacture due to the simple structure of each DRAM cell. SRAM cells, on the other hand, have faster access times, do not lose their data content unless power is removed from the SRAM cell and are relatively more expensive since each SRAM cell is more complicated than a DRAM cell. CAM cells have a unique function of being able to address content easily within the cells and are more expensive to manufacture since each CAM cell requires more circuitry to achieve the content addressing functionality.

Various computation devices that may be used to perform computations on digital, binary data are also well-known. The computation devices may include a microprocessor, a CPU, a microcontroller and the like. These computation devices are typically manufactured on an integrated circuit, but may also be manufactured on an integrated circuit that also has some amount of memory integrated onto the integrated circuit. In these known integrated circuits with a computation device and memory, the computation device performs the computation of the digital binary data bits while the memory is used to store various digital binary data including, for example, the instructions being executed by the computation device and the data being operated on by the computation device.

More recently, devices have been introduced that use memory arrays or storage cells to perform computation operations. In some of these devices, a processor array to perform computations may be formed from memory cells. These devices may be known as in-memory computational devices.

Big data operations are data processing operations in which a large amount of data must be processed. Machine learning uses artificial intelligence algorithms to analyze data and typically require a lot of data to perform. The big data operations and machine learning also are typically very computationally intensive applications that often encounter input/output issues due to a bandwidth bottleneck between the computational device and the memory that stores the data. The above in-memory computational devices may be used, for example, for these big data operations and machine learning applications since the in-memory computational devices perform the computations within the memory thereby eliminating the bandwidth bottleneck.

The in-memory computational devices typically use well known standard SRAM or DRAM or CAM memory cells that may perform computations. For example, a standard 6T SRAM cell that can be used for computation is shown in FIG. 1. The standard 6T SRAM cell may have a bit line (BL) and a complementary bit line (BLb) and a word line (WL) that are connected to the cell. The cell may include two access transistors (M13, M14) and each access transistor has a source coupled to the bit lines (BL and BLb), respectively. Each access transistor also has a gate and the gate of both access transistors is connected to the word line (WL) as shown in FIG. 1. The drain of each access transistor may be connected to a pair of inverters (I11, I12) that are cross coupled to each other. One side of the cross coupled inverters nearest the bit line BL may be labeled D and the other side of the cross coupled inverters nearest the complementary bit line (BLb) may be labeled Db. The cross-coupled inverters acts as a storage element of the SRAM cell as is known in the art and the reading/writing of data to/from the SRAM cell is known in the art and is now described in more detail.

When two cells connected to the same bit line are turned on, the bit line (BL) can perform an AND function of the two bits of data stored in the cells. During a read cycle, both BL and BLb have a static pull up transistor, and if the data in both of the cells is logic high "1", then the BL stays as 1. If any or both of the data in the cells is/are logic low "0", then the BL is pulled to a lower level and will be a logic 0. By sensing the BL level, an AND function is performed using the 2 cells. Similarly, if 3 cells are turned on, the BL value is a result of an AND function of data stored in the 3 cells. During a writing operation, multiple word lines (WL) can be turned on, so multiple cells can be written at the same time. In addition, the write can be done selectively, or Selective Write, meaning no write will be performed if both BL and BLb are held high during the write cycle.

The cell shown in FIG. 1 has its drawbacks. On a read cycle, when multiple cells are turned on, if all but one cell stores a low logic value of "0", then the BL voltage level is a ratio of the pull down transistors of the "0" cell against the BL pull up transistor. If the BL voltage level is too low, then it will cause the cell storing a logic "1" to flip to logic "0". As a result, it would seem desirable to have a strong BL pull up transistor to allow more cells to be turned on. However, if only 1 cell contains "0" data during reading, a strong BL pull up transistor make the "0" signal small so that the data is difficult to sense.

On a write cycle, the cell in FIG. 1 also has drawbacks. If multiple cells into which data is to be written are active, the BL driver for writing needs to strong enough to flip the driver of each memory cell's latch devices, I11 and I12 shown in FIG. 1. Furthermore, the more WLs that are turned on in the write cycle, the stronger the write driver needs to be which is undesirable.

On a Selective Write cycle, the cell in FIG. 1 also has drawbacks. In particular, the BL pull up transistor needs to be strong to fight against the "0" stored in the multiple active cells. Similar to the read cycle above, when all but one cell is active and contains a "0", then the lone cell containing a "1" is susceptible to the instability caused by the lower BL level.

Thus, it is desirable to have a SRAM cell that may be used for computation that does not have drawbacks of the typical 6T SRAM cell shown in FIG. 1.

BRIEF DESCRIPTION OF THE DRAWINGS

FIG. 5 is a write port truth table for the dual port SRAM cell of FIG. 4;

DETAILED DESCRIPTION OF ONE OR MORE EMBODIMENTS

The disclosure is particularly applicable to a static random access memory (SRAM) cell or array of cells or a processing array having the different layouts set forth below and it is in this context that the disclosure will be described. It will be appreciated, however, that the SRAM device and the processing array using the SRAM cells has greater utility since each SRAM cell may be configured/laid out differently than the embodiments described below and the changes to the configuration/layout of the dual port SRAM cell that may be used for computation are within the scope of the disclosure. For purposes of illustration, a dual port SRAM cell is disclosed below and in the figures. However, it is understood that the SRAM computation cell and processing array may also be implemented with an SRAM cell having three or more ports and the disclosure is not limited to the dual port SRAM cell disclosed below. It is also understood that the SRAM cell having three or more ports may be slightly differently constructed than the dual port SRAM shown in the figures, but one skilled in the art would understand how to construct those three or more port SRAMs for the disclosure below.

Furthermore, although an SRAM cell is used in the examples below, it is understood that the disclosed memory cell for computation and the processing array using the memory cells may be implemented using various different types of memory cells including the DRAMs, CAMs, non-volatile memory cells and non-volatile memory devices and these implementations using the various types of memory cells are within the scope of the disclosure.

Figure 1:
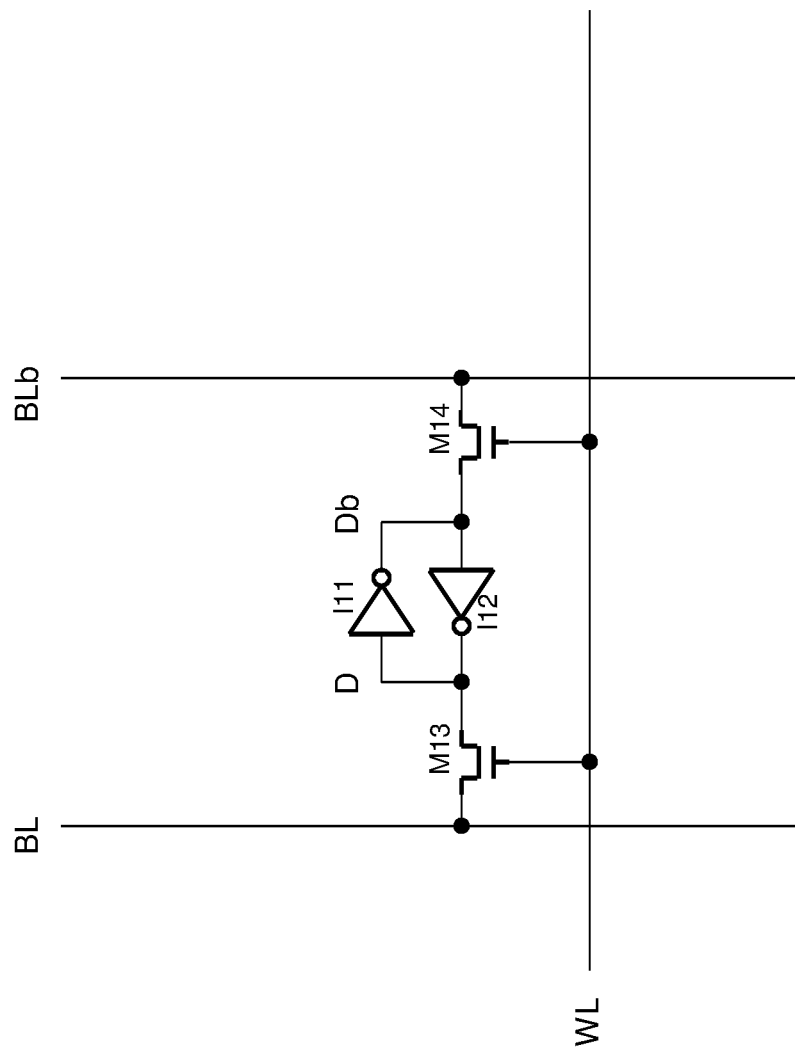
FIG. 1 illustrates a typical six transistor static random access memory cell.
Figure 2:
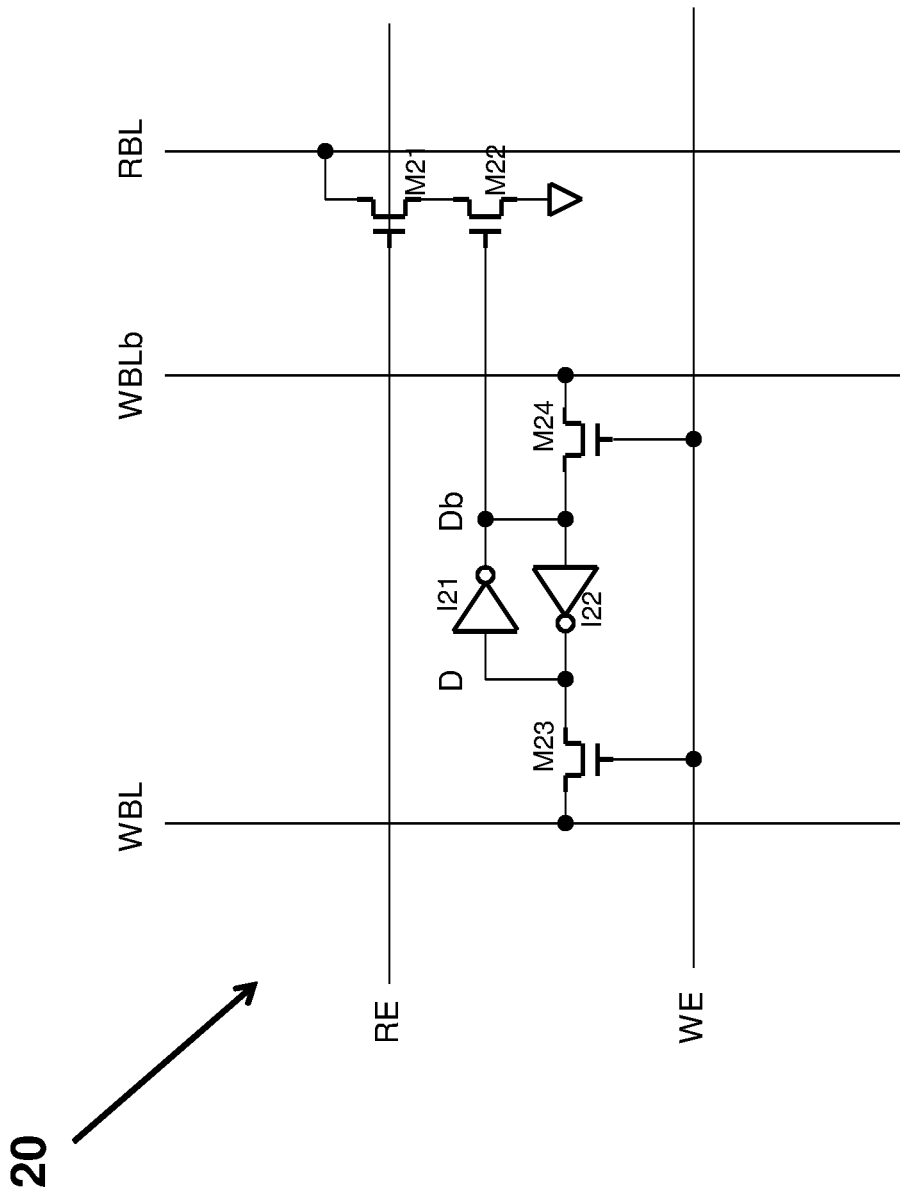
FIG. 2 illustrates a first embodiment of a dual port SRAM cell that may be used for computation.

FIG. 2 illustrates a first embodiment of a dual port SRAM cell 20 that may be used for computation that overcomes the drawbacks of the typical SRAM cell shown in FIG. 1. The dual port SRAM cell may include two cross coupled inverters I21, I22 and two access transistors M23 and M24 that are coupled together as shown in FIG. 2 to form an SRAM cell. The SRAM cell may be operated as a storage latch and may have a read port and a write port so that the SRAM cell is a dual port SRAM cell. The two inverters are cross coupled since the input of the first inverter is connected to the output of the second inverter and the output of the first inverter is coupled to the input of the second inverter as shown in FIG. 2. A Write Word line carries a signal and is called WE (see FIG. 2) and a write bit line and its complement are called WBL and WBLb, respectively. The Write word line (WE) is coupled to the gate of each of the two access transistors M23, M24 that are part of the SRAM cell. The write bit line and its complement (WBL and WBLb) are each coupled to a source of the respective access transistors M23, M24 as shown in FIG. 2 while the drain of each of those access transistors M23, M24 are coupled to each side of the cross coupled inverters (labeled D and Db in FIG. 2.)

The circuit in FIG. 2 may also have a read word line RE, a read bit line RBL and a read port formed by transistors M21, M22 coupled together to form an isolation circuit. The read word line RE may be coupled to the gate of transistor M21 that forms part of the read port while the read bit line is coupled to the drain terminal of transistor M21. The gate of transistor M22 may be coupled to the Db output from the cross coupled inverters I21, I22 and the source of transistor M22 may be coupled to ground.

In operation, the dual port SRAM cell may read data stored in the latch using a signal on the read word line (RE) to address/activate the dual port SRAM cell and the read bit line (RBL) to read the data stored in the dual port SRAM cell. The dual port SRAM cell may write data into the dual port SRAM cell by addressing/activating the dual port SRAM cell using a signal on the write word line (WE) and then writing data into the dual port SRAM cell using the word bit lines (WBL, WBLb).

During reading, multiple cells (with only a single cell being shown in FIG. 2 but multiple cells shown in FIG. 3) can be turned on to perform an AND function between the data stored in the cells that were turned on. For example, a number of cells in a column of the processing array 30 in FIG. 3, such as cell 00, . . . , cell m0, may be activated by the RE signal for each of those cells. Thus, at the beginning of the read cycle, RBL is pre-charged high and if the Db signal of all cells that are turned on by RE are "0", then RBL stays high since, although the gate of transistor M21 is turned on by the RE signal, the gate of M22 is not turned on since the Db signal is low. As a result, the RBL line is not connected to the ground to which the source of transistor M22 is connected and the RBL line is not discharged. The cell 20 may operate as dual-port SRAM cell. The write operation is activated by WE and the data is written by toggling of WBL and WBLb. The read operation is activated by RE and the read data is accessed on RBL. The cell 20 may further be used for computation where RBL is also used for logic operation. If the Db signal of any or all of the cells is "1" then RBL is discharged to 0 since the gate of M22 is turned on and the RBL line is connected to ground. As a result, RBL=NOR (Db0, Db1, etc.) where Db0, Db1, etc. are the complementary data of the SRAM cells that have been turned on by the RE signal. Alternatively, RBL=NOR (Db0, Db1, etc.)=AND (D0, D1, etc.), where D0, D1, etc. are the true data of the cells that have been turned on by the RE signal.

As shown in FIG. 2, the Db signal of the cell 20 may be coupled to a gate of transistor M22 to drive the RBL line. However, unlike the typical 6T cell, the Db signal is isolated from the RBL line and its signal/voltage level by the transistors M21, M22 (together forming the isolation circuit). Because the Db signal/value is isolated from the RBL line and signal/voltage level, the Db signal is not susceptible to the lower bit line level caused by multiple "0" data stored in multiple cells in contrast to the typical SRAM cell in FIG. 1. Therefore, for the cell in FIG. 2, there is no limitation of how many cells can be turned on to drive RBL. As a result, the cell (and the device made up of multiple cells) offers more operands for the Boolean functions such as AND function described above and NOR/OR/NAND functions and search operation described below since there is no limit of how many cells can be turned on to drive RBL. Furthermore, in the cell in FIG. 2, the RBL line is pre-charged (does not use a static pull up transistor as with the typical 6T cell) so this cell can provide much faster sensing because the current generated by the cell is all being used to discharge the bit line capacitance with no current being consumed by a static pull up transistor so that the bit line discharging rate can be more than 2 times faster than the typical SRAM cell. The sensing for the disclosed cell also requires less power without the extra current consumed by a static pull up transistor and the discharging current is reduced by more than half.

The write port of the cell in FIG. 2 is operated in the same manner as the 6T typical SRAM cell described above. As a result, the write cycle and Selective Write cycle for the cell in FIG. 2 have the same limitation as the 6T cell discussed above. In addition to the AND function described above, the SRAM cell 20 in FIG. 2 also may perform a NOR function by storing inverted data. Specifically, if D is stored at the gate of M22, instead of Db, then RBL=NOR (D0, D1, etc.). One skilled in the art understand that the cell configuration shown in FIG. 2 would be slightly altered to achieve this, but that modification is within the scope of the disclosure.

Figure 3:
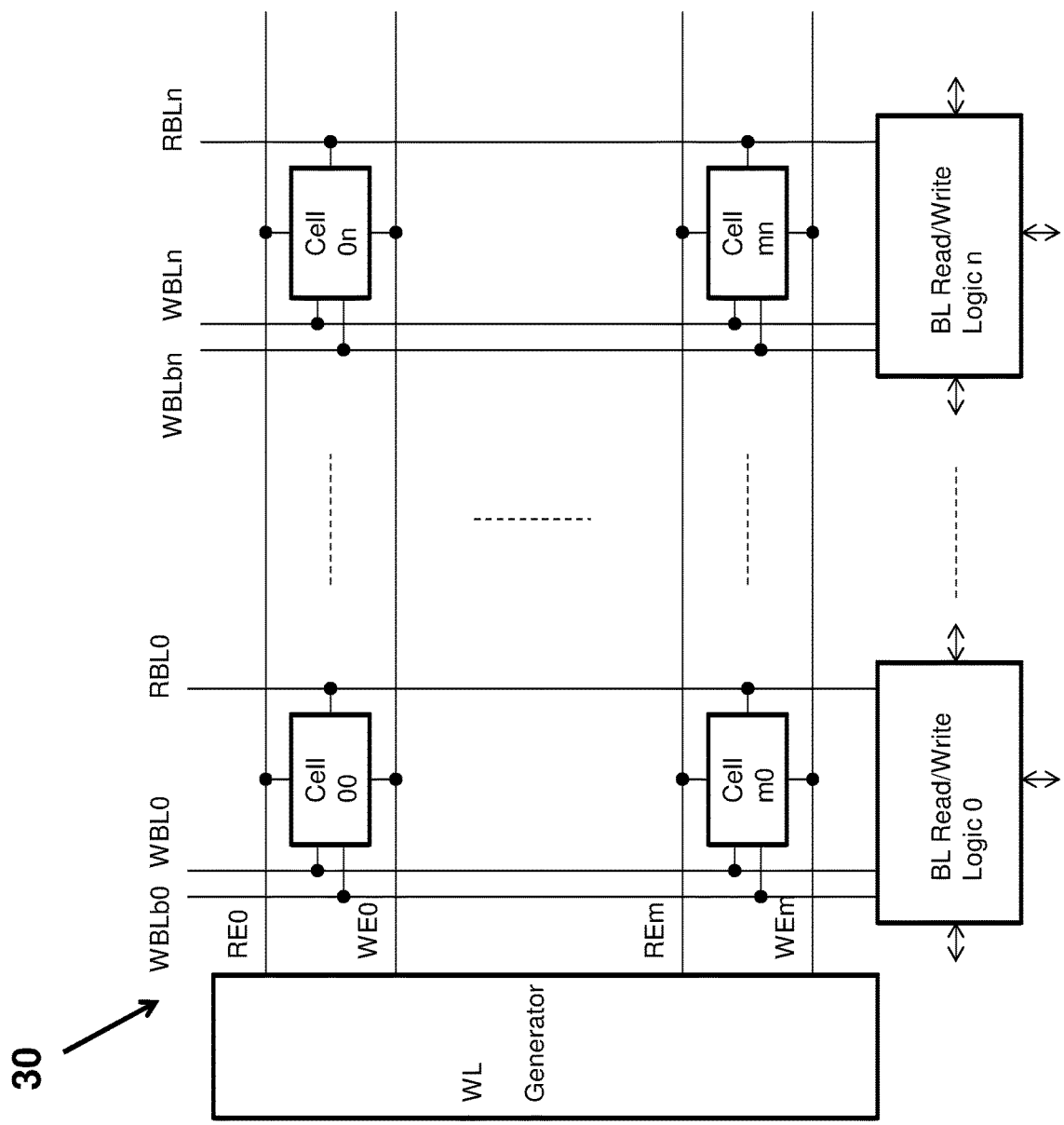
FIG. 3 illustrates a processing array device that may incorporate the dual port SRAM cell of FIG. 2, 4, 6 or 7.

FIG. 3 illustrates a processing array device 30 that may incorporate the dual port SRAM cell of FIG. 2, 4, 6 or 7 in which each cell, such as cell 00, . . . , cell 0n and cell m0, . . . , cell mn, is the cell shown in FIG. 2, 4, 6 or 7. The cells form an array of cells laid out as shown in FIG. 3. The processing array 30 may perform computations using the computational capabilities of the dual port SRAM cell described above. The array device 30 may be formed by M word lines (such as RE0, WE0, . . . , REm, WEm) and N bit lines (such as WBL0, WBLb0, RBL0, . . . , WBLn, WBLbn, RBLn.) The array device 30 may also include a word line generator (WL Generator) that generates word line signals as well as a plurality of bit line read/write logic (such as BL Read/Write Logic 0, . . . , BL Read/Write Logic n) that perform read and write operations using the bit lines. The array device 30 may be manufactured on an integrated circuit or may be integrated into another integrated circuit depending on the use of the processing array 30.

In a read cycle, the word line generator may generate one or multiple RE signals in a cycle to turn on/activate one or more cells and the RBL lines of the cells activated by the RE signal form AND or NOR functions whose output is sent to the respective BL Read/Write Logic. The BL Read/Write Logic processes the RBL result (the result of the AND or NOR operation) and sends the results back to its WBL/WBLb for use/writing back to the same cell, or to the neighboring BL Read/Write Logic for use/writing back to the neighboring cell, or send it out of the processing array. Alternatively, the BL Read/Write logic can store the RBL result from its own bit line or from the neighboring bit line in a latch within the BL Read/Write Logic so that, during a next or later cycle, the Read/Write logic can perform logic with the latched data that is the RBL result.

In a write cycle, the word line generator generates one or more WE signals for the cells into which data is to be written. The BL Read/Write Logic processes the write data, either from its own RBL, or from the neighboring RBL, or from out of the processing array. The ability of BL Read/Write Logic to process the data from the neighboring bit line means that the data can be shifting from one bit line to the neighboring bit line and one or more or all bit lines in the processing array may be shifting concurrently. The BL Read/Write Logic can also decide not to write for a Selective Write operation based on the RBL result. For example, the data on the WBL line can be written to a cell if RBL=1. If RBL=0, then write operation is not performed.

Figure 4:
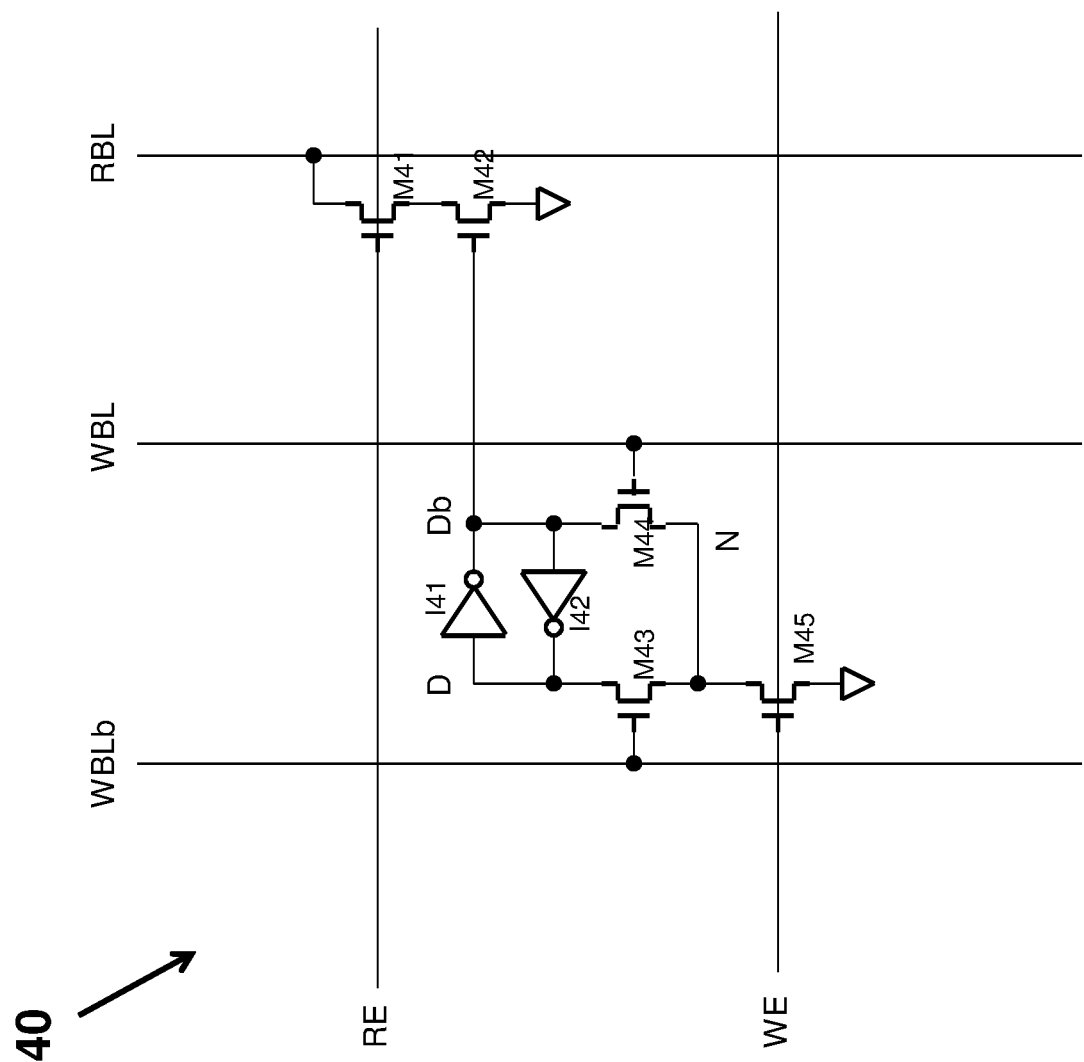
FIG. 4 illustrates a second embodiment of a dual port SRAM cell that may be used for computation.

FIG. 4 illustrates a second embodiment of a dual port SRAM cell 40 that may be used for computation. The read port operation of this cell is same as the cell in FIG. 2, but the write port operation as described below is improved. In the cell in FIG. 4, a pair of cross coupled inverters I41 and I42 form a latch as a storage element. The cell in FIG. 4 has the same isolation circuits (M41, M42) for the read bit line as described above.

Transistors M43, M44 and M45 form a write port. This cell can be arrayed in the array device 30 as shown in FIG. 3 with WE running horizontally and WBL and WBLb running vertically. FIG. 5 shows the truth table of the write port. If WE is 0, no write is performed. If WE is 1, then the storage nodes D and its complement Db are written by WBL and WBLb. Specifically, D=1 and Db=0 if WBL=1 and WBLb=0 and D=0 and Db=1 if WBL=0 and WBLb=1. If both WBL and WBLb are 0, then no write is performed and the data storage is the data storage in the storage element before the current write cycle (D(n−1) as shown in FIG. 5. Thus, this cell can perform Selective Write function with WBL=WBLb=0. In the cell, M45 is activated by the write word line (WE) signal coupled to the gate of M45 and pulls the sources of transistors M43, M44 to ground.

Returning to FIG. 4, unlike the dual port cell in FIG. 2, this cell's WBL and WBLb lines are driving the gate of transistors M44 and M43, instead of the source. Therefore, the driver strength of WBL and WBLb is not limited by the number of the cells turned on. On Selective Write operation, WBL and WBLb do not require a strong device to hold the WBL and WBLb signal level, and there is no limitation how many cells can be turned on. As with the cell in FIG. 2, the cell in FIG. 4 may be used in the processing array of FIG. 3.

During a write cycle, the WE signal of each unselected cell is 0, but one of the signals on the WBL and WBLb is 1. For example, in FIG. 3, WEm is 1 for the cell m0 to be written, but WE0 is 0 for cell 00 not to be written. In FIG. 4, D and Db of the unselected cell shall keep its original value. However, if D of the unselected cell stores a "1" and the drain of M45 is 0 and WBLb is 1, then the access transistor M43's gate is turned on and the capacitance charge of node D is charge sharing with the capacitance of node N from the drain of M45 and sources of M43 and M44. The high level of D is lower by this charge sharing, and if the node N capacitance is high enough, the level will be lower such that I41 and I42 latch flip to the opposite data.

Figure 6:
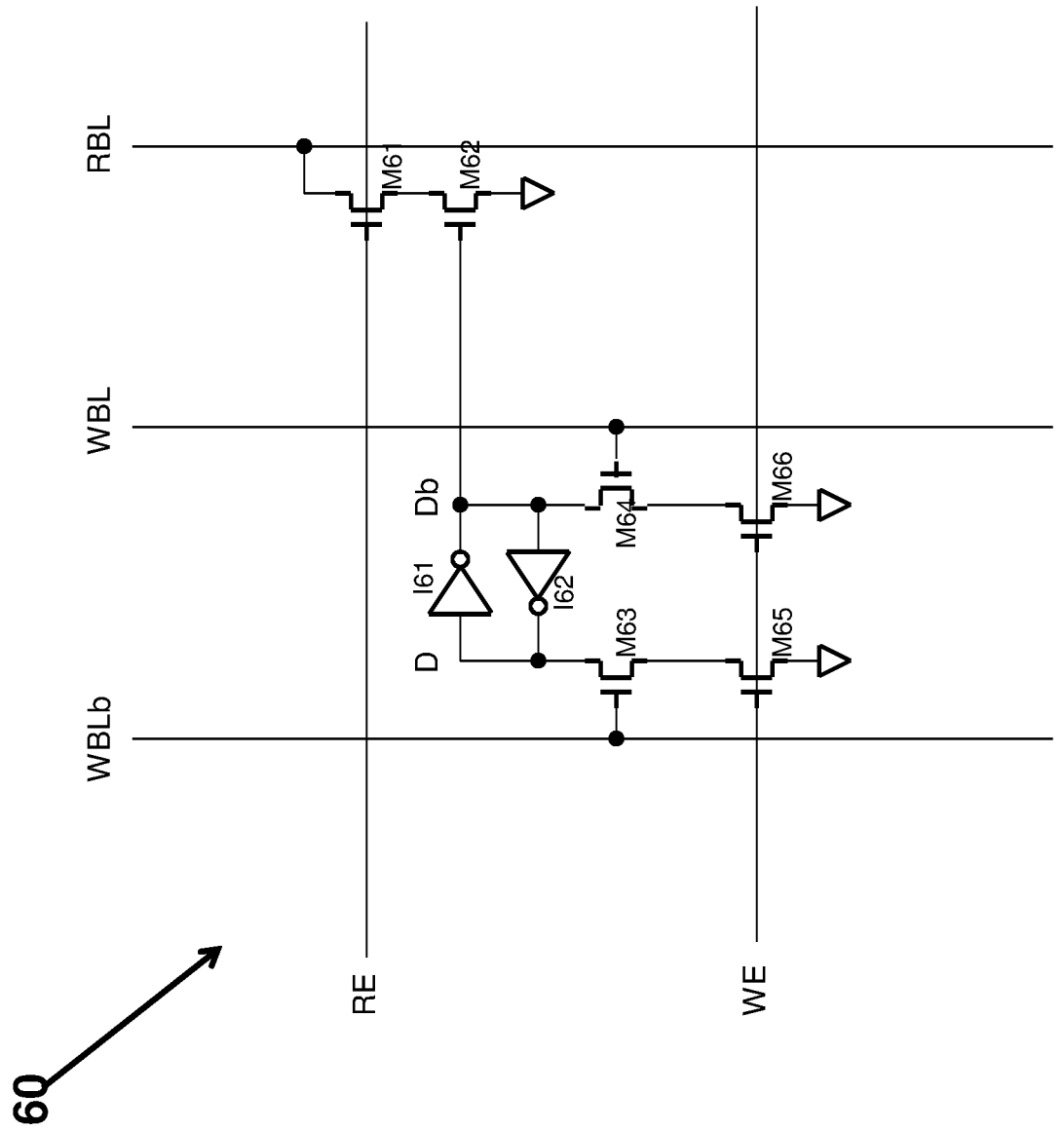
FIG. 6 illustrates a third embodiment of a dual port SRAM cell that may be used for computation.

FIG. 6 illustrates a third embodiment of a dual port SRAM cell 60 that may be used for computation. As with the other embodiments above, this cell may be used in the processing array 30 described above. The cell in FIG. 6 has the same isolation circuits (M61, M62) for the read bit line as described above. The cell 60 also has the same cross coupled inverters I61, I62 as well as the two access transistors M63, M64 which have each of their gates coupled to the write bit line and the complementary write bit line as was the case for the cell in FIG. 4. In the cell in FIG. 6, the M45 transistor in FIG. 4 may be split into a first write port transistor M65 and a second write port transistor M66 so that transistors M63, M64, M65 and M66 form the write port circuitry. Thus, the node D can only charge share with a drain of M65 and a source of M63, and the source of M64 is no longer affects node D that the high voltage level of node D can hold higher to avoid the data flipping to the opposite state. This improves the weakness of the unselected cell's charge sharing. Another way to modify the cell in FIG. 4 is to increase the capacitance of node D by having bigger gate size of I41 and I42. Note that node Db is less susceptible with extra capacitance of M42.

Figure 7:
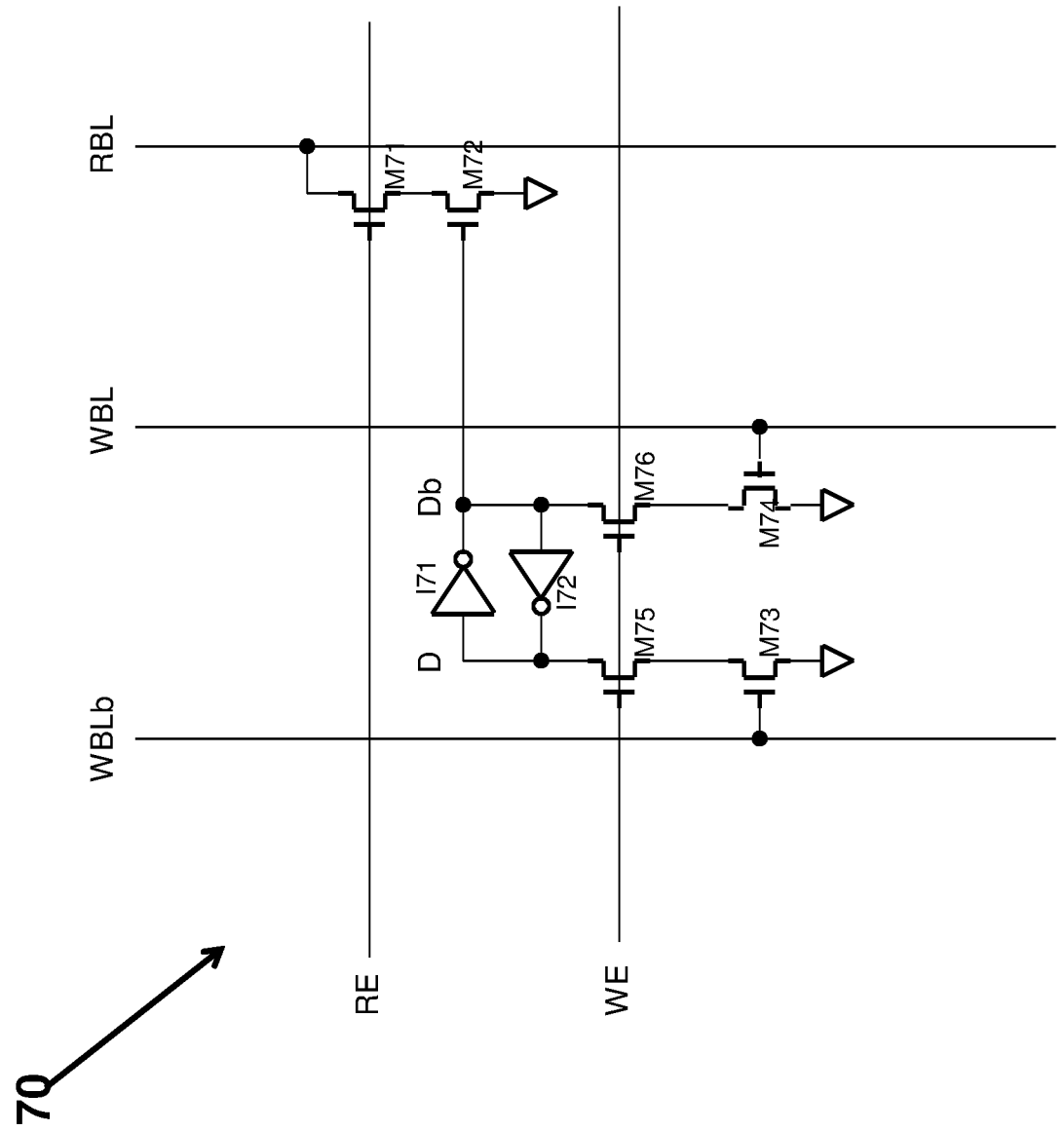
FIG. 7 illustrates a fourth embodiment of a dual port SRAM cell that may be used for computation.

FIG. 7 illustrates a fourth embodiment of a dual port SRAM cell 70 that may be used for computation. As with the other embodiments, this cell may be used in the processing array 30 described above. The cell in FIG. 7 has the same isolation circuits (M71, M72) for the read bit line as described above. The cell 70 also has the same cross coupled inverters I71, I72 as well as the two access transistors M75, M76 which have their respective gates coupled to the write word line WE. The SRAM cell may further include transistors M73, M74 whose gates are coupled to the write bit line and the complementary write bit line. The transistors M73, M74, M75 and M76 form the write port circuitry. The cell 70 work similarly to the cell 60 in FIG. 6.

Figure 9:
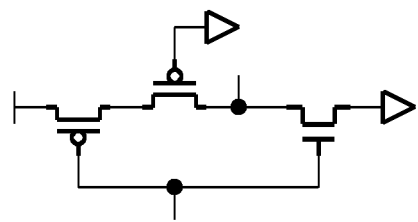
FIGS. 8 and 9 illustrate two examples of a latch inverter that may be used in the dual port SRAM cells shown in FIG. 2, 4, 6 or 7.
Figure 8:
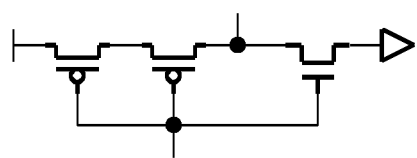

Returning to FIGS. 4, 6 and 7, the latch device (I41 and I42 in FIG. 4 for example) can be a simple inverter. To do a successful writing, the driver strength of series transistor M43 and M45 in FIG. 4 needs to be stronger than the pull up PMOS transistor of I42 and this ratio needs to be around 2 to 3 times so that the driver strength of transistor M43 and M45 may optimally be 2-3 times stronger than the pull up PMOS transistor of I42. In advanced technology like 28 nm or better, the layout of the PMOS and NMOS transistors is preferred to have an equal length. So, when the cells of FIGS. 4, 6 and 7 are produced using 28 nm or better feature size, the PMOS transistor of I41 and I42 could be actually 2 or more PMOS transistors in series as is shown in FIG. 8. For the ease of the layout, 1 or more of the series PMOS transistor could be tied to ground as shown in FIG. 9. The latch inverter in FIGS. 8 and 9 can be used in all of the embodiments of the SRAM cells described above.

Returning to FIG. 2, the read port transistors M21 and M22 (the isolation circuits) can be PMOS instead of NMOS as shown in FIG. 2. If transistors M21 and M22 are PMOS with the source of M22 coupled to VDD, then RBL is pre-charged to 0 and RBL is 1 if Db of one or more cells turned on is 0 and RBL is 0 if Db of all cells is 1. In other words, RBL=NAND (Db0, Db1, etc.)=OR (D0, D1, etc.), where D0, D1, etc. are the true data of the cells turned on and Db0, Db1, etc. are the complement data. It can also perform NAND function by storing inverted data such that if D is stored at the gate of M22, instead of Db, then RBL=NAND (D0, D1, etc.). The read port formed by PMOS can be used in all dual port cells in FIG. 2, 4, 6 or 7 for OR and NAND function.

The processing array 30 in FIG. 3 may thus have differently configured dual port SRAM cells within this array shown in FIG. 3. For example, the processing array 30 in FIG. 3 may have some dual port SRAM cells with NMOS read port transistors and some dual port SRAM cells with PMOS read port transistors. The processing array 30 may also have other combinations of dual port SRAM cells.

One example of the application for the processing array (an example of which is shown in FIG. 3) that is comprised of the dual port SRAM cells shown in FIGS. 2, 4, 6 and 7 is a search operation. For a 1 bit search operation, 2 cells store the true (D) and complement (Db) data along the same bit line. The search is performed by entering the search key S as RE of the true data and Sb, the complement of S, as RE of the complement data. If S=1, Sb=0, then RBL=D=AND (S, D). If S=0, Sb=1, then RBL=Db=AND(Sb,Db). So RBL=OR(AND(S, D), AND(Sb, Db)=XNOR(S,D). In other words, RBL=1 if S=D and RBL=0 if S≠D.

As another example, for an 8-bit word search, the data of an 8-bit word is stored in 8 cells, D[0:7], along the same bit line and the complement data of this 8-bit word is stored in another 8 cells, Db[0:7], also along the same bit line as the true data. The search key can be entered as 8 bits S[0:7] applied to the RE of the true data cells D[0:7] and 8 bits Sb[0:7] (Complement of S) applied to the RE of the complement data cell Db[0:7]. The bit line can be written as RBL=AND (XNOR (S[0], D[0]), XNOR (S[1], D[1]), . . . , XNOR(S[7], D[7]). If all 8 bits are matched, then RBL is 1. If any one or more bits are not matched, then RBL=0. Parallel search can be performed in one operation by arranging multiple data words along the same word line and on parallel bit lines with each word on one bit line. In such manner, the search result of every bit lines in the process array is generated in one operation.

The processing array (an example of which is shown in FIG. 3) that is comprised of the dual port SRAM cells shown in FIGS. 2, 4, 6 and 7 can operate the read and write logic on the same bit line concurrently. In other words, multiple RE and WE signals on the same bit line can be turned on at the same time to perform read logic on read bit line and write logic on write bit line concurrently. This improves the performance of the cells and the processing array over the typical single port SRAM shown in FIG. 1.

Thus, a dual port static random access memory computation cell is disclosed that has a SRAM cell having a latch, a read port for reading data from the SRAM cell and a write port for writing data to the SRAM cell and an isolation circuit that isolates a data signal representing a piece of data stored in the latch of the SRAM cell from a read bit line. The read port may have a read word line that is coupled to the isolation circuit and activates the isolation circuit and the read bit line that is coupled to the isolation circuit and the write port has a write word line, a write bit line and complementary write bit line coupled to the SRAM cell. In the cell, the isolation circuit may further include a first transistor whose gate is coupled to the read word line and a second transistor whose gate is coupled to the data signal and the isolation circuit first and second transistors are both NMOS transistors or both PMOS transistors. The data signal of the cell may be a data signal or a complementary data signal. The SRAM cell may further have a first inverter having an input and an output and a second inverter having an input coupled to the output of the first inverter and an output coupled to the input of the first inverter, a first access transistor coupled to the input of the first inverter and the output of the second inverter and coupled to a write bit line and a second access transistor coupled to the output of the first inverter and the input of the second inverter and coupled to a complementary write bit line. The write port may further comprise a write word line coupled to the gates of the first and second access transistor and the write bit line and complementary write bit line coupled, respectively, to a source of each of the access transistors.

In another embodiment, the SRAM cell further comprises a first inverter having an input and an output and a second inverter having an input coupled to the output of the first inverter and an output coupled to the input of the first inverter, a first access transistor coupled to the input of the first inverter and the output of the second inverter and a gate of the first access transistor coupled to a write bit line and a second access transistor coupled to the output of the first inverter and the input of the second inverter and a gate of the second access transistor coupled to a complementary write bit line. In the other embodiment, the write port further comprises a write word line coupled to a gate of a write port transistor, a drain of the write port transistor coupled to a source of the first access transistor and a source of the second access transistor.

In yet another embodiment, the SRAM cell further comprises a first inverter having an input and an output and a second inverter having an input coupled to the output of the first inverter and an output coupled to the input of the first inverter, a first access transistor coupled to the input of the first inverter and the output of the second inverter and a gate coupled to a write bit line and a second access transistor coupled to the output of the first inverter and the input of the second inverter and a gate coupled to a write complementary bit line. In that embodiment, the write port further comprises a write word line coupled to a gate of each of a first and second write port transistors, a drain of the first write port transistor coupled to a source of the first access transistor and a drain of the second write port transistor coupled to a source of the second access transistor.

In another embodiment, the SRAM cell further comprises a first inverter having an input and an output and a second inverter having an input coupled to the output of the first inverter and an output coupled to the input of the first inverter, a first access transistor coupled to the input of the first inverter and the output of the second inverter and a gate of the first access transistor being coupled to a write word line and a second access transistor coupled to the output of the first inverter and the input of the second inverter and a gate of the second access transistor being coupled to the write word line. In this embodiment, the write port further comprises a first write port transistor whose gate is coupled to a complementary write bit line and whose drain is coupled to a source of the first access transistor and a second write port transistor whose gate is coupled to a write bit line and whose drain is coupled to a source of the second access transistor.

Each of the different embodiments of the dual port static random access memory computation cell can perform a Selective Write operation and can perform a Boolean AND, a Boolean NOR, a Boolean NAND or a Boolean OR operation. Each of the different embodiments of the dual port static random access memory computation cell can also perform search operation.

A processing array is also disclosed that has a plurality of dual port SRAM cells arranged in an array, a word line generator that is coupled to a read word line signal and a write word line signal for each dual port SRAM cell in the array and a plurality of bit line read and write logic circuits that are coupled to the read bit line, write bit line, complementary write bit line of each dual port SRAM cell. In the processing array, each dual port SRAM cell is coupled to a write word line and a read word line whose signals are generated by the word line generator and also being coupled to a read bit line, a write bit line and a complementary write bit line that are sensed by one of the plurality of bit line read and write logic circuits and each dual port SRAM cell having an isolation circuit that isolates a data signal representing a piece of data stored in the latch of the SRAM cell from a read bit line. In the processing array, one or more of the dual port SRAM cells are coupled to the read bit lines and perform a computational operation. The processing array may utilize the above disclosed dual port SRAM cells. The processing array can perform a Selective Write operation and can perform a Boolean AND, a Boolean NOR, a Boolean NAND or a Boolean OR operation. The processing array can also perform a search operation. The processing array can also do parallel shifting operation to shift the data from one bit line to the neighboring bit line on one or more or all bit lines concurrently. Furthermore, the processing array can activate read and write logic concurrently.

As set forth above, the disclosed computation SRAM cell and processing array may be implemented using an SRAM cell having more than 2 ports, such as a 3 port SRAM, a 4 port SRAM, etc. For example, the SRAM computation cell may be a 3-port cell that has 2 read ports and 1 write port. In this non-limiting example, the 3 port SRAM cell may be used to perform an operation like Y=OR (AND (A, B), AND (A,C)) more efficiently. Using the 3 port SRAM, the value of variable A is used twice using the 2 read ports. In this example operation, Y can be calculated in one cycle in which an AND (A,B) result is on RBL1 and an AND (A,C) result is on RBL2; and on the same cycle RBL2 data can be sent to RBL1 to do the OR operation to generate the final result. Therefore, this logic equation/operation can be done in 1 cycle when word lines are toggled once to generate the result, compared to 2 cycles of the dual port cell. Similarly, a 4 port SRAM cell could be used as well and the disclosure is not limited to any particular number of ports of the SRAM cell.

Figure 10:
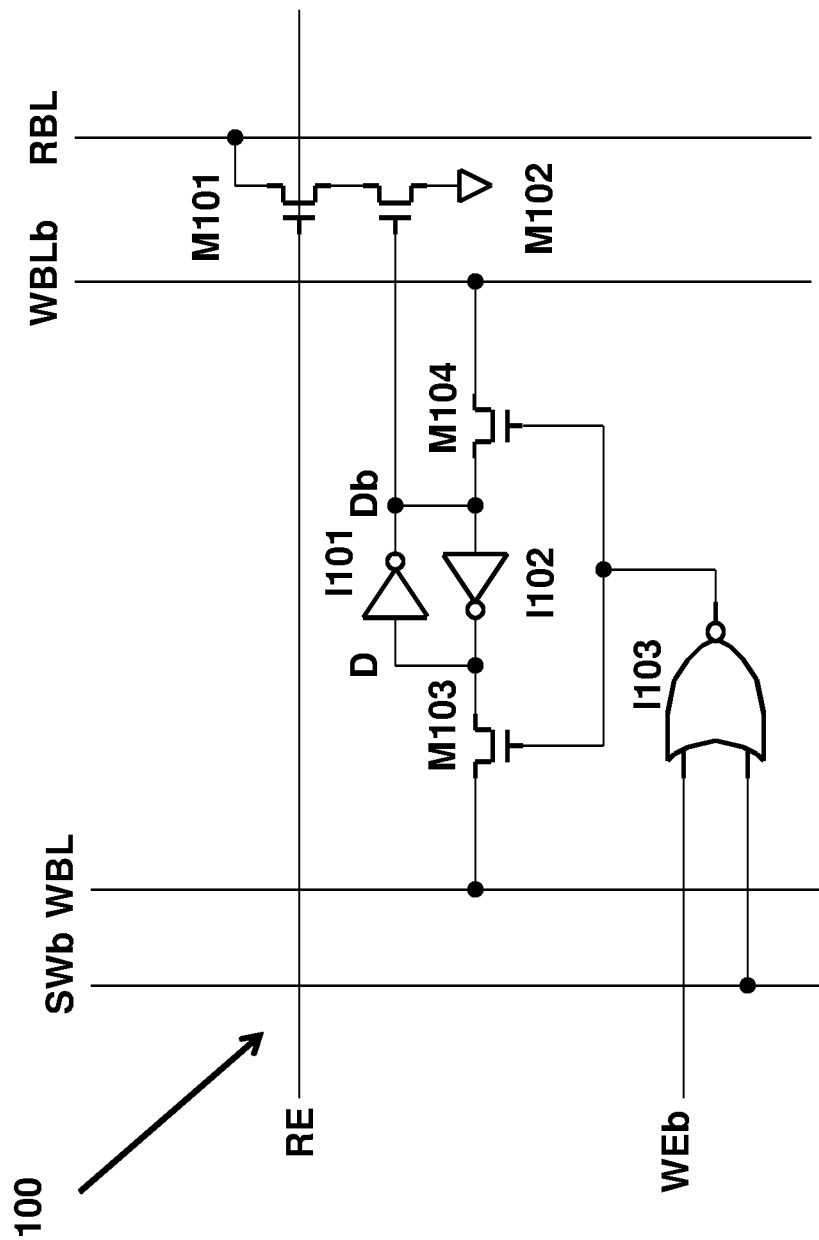
FIG. 10 illustrates an implementation of a dual port SRAM cell that may be used for computation.

FIG. 10 illustrates an implementation of a dual port SRAM cell 100 that may be used for computation. The cell in FIG. 10 has the same isolation circuits (M101, M102) for the read bit line, the same storage latches (I101, I102), the same access transistors (M103, M104), the same write bit line and complementary write bit line, as well as the same read word line as the cell described in FIG. 2. However, the Selective Write implementation is different in FIG. 10. The active low write word line, WEb, is connected to an input of a NOR gate (I103) and the other input to connected to an active low Selective Write control signal, SWb, to control the gate of access transistors M103 and M104. SWb is running in the same direction as the bit line. In this implementation, the writing to the cell can only happen when both the write word line and selective write control signals are active.

Figure 11:
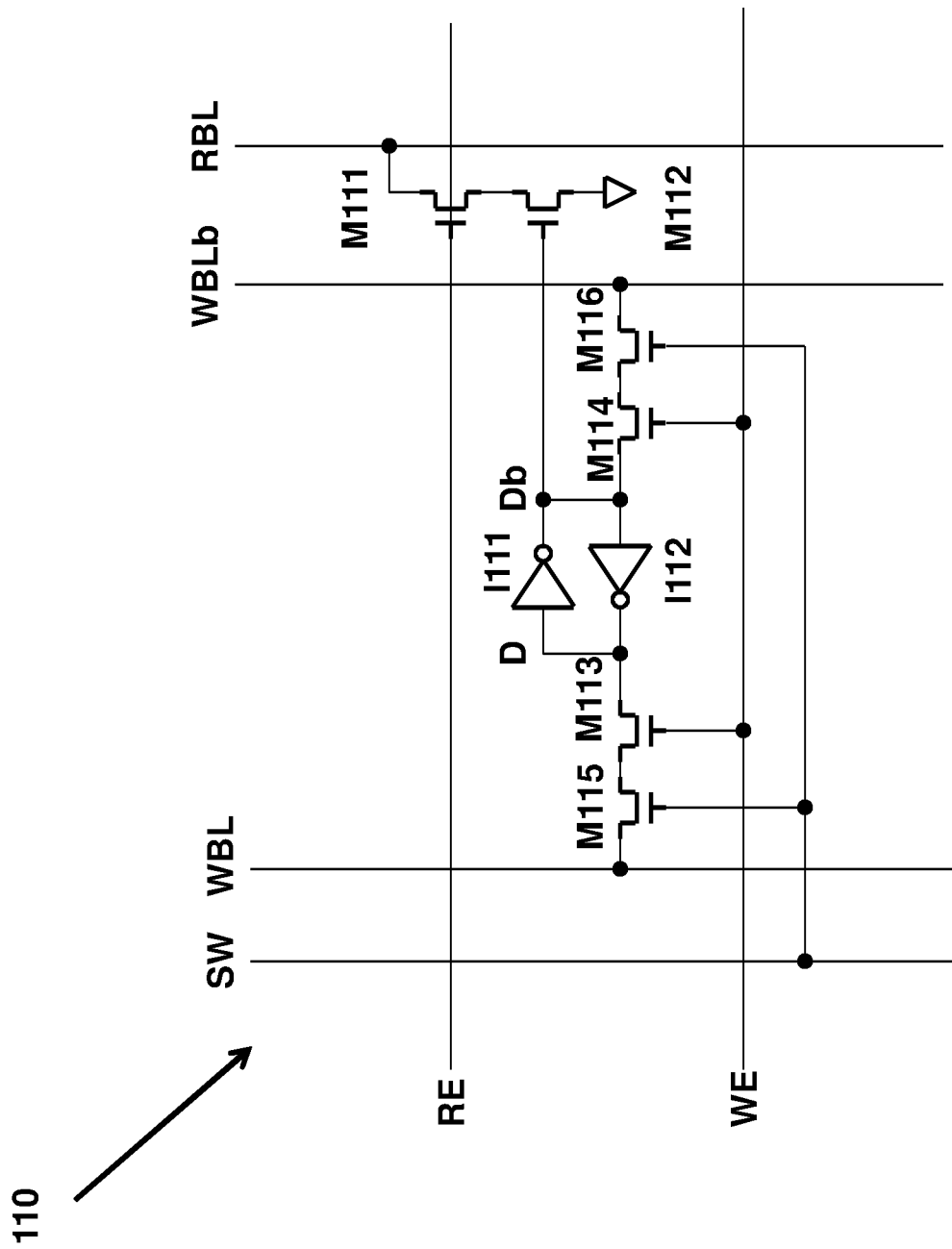
FIG. 11 illustrates another implementation of a dual port SRAM cell that may be used for computation.

FIG. 11 illustrates another implementation of a dual port SRAM cell 110 that may be used for computation. FIG. 11 is similar to FIG. 10, with selective write control signal SW, to combine with write word line, WE, to control the selective write operation. 2 access transistors M113 and M115 are in series to couple the storage latches to write bit line, WBL, and similarly, 2 access transistors M114 and M116 are in series to couple the storage latches to complementary write bit line, WBLb. The gates of M113 and M114 are coupled to WE and the gates of M115 and M116 are coupled to SW. SW is running in the same direction as the bit line. The writing to the cell can only happen when both write word line and selective write signals are active.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include and/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A memory cell for computation, comprising:
   a storage cell having a data output and a complementary data output;
   at least one read bit line;
   an isolation circuit that buffers the storage cell from signals on the at least one read bit line;
   a read port for reading data from the storage cell that has a read word line that is coupled to the isolation circuit;
   the isolation circuit being activated by the read word line of the read port and the complementary data output from the storage cell;
   a write port for writing data to the storage cell that has a write word line and a pair of access transistors wherein a gate of each access transistor is connected to the write word line and whose drains are connected to the data output and the complementary data output of the storage cell;
   wherein the memory cell is capable of performing a logic function when the memory cell is connected to the at least one read bit line with another memory cell by turning on the memory cells connected to the at least one read bit line; and
   wherein the read bit line is capable of being used to provide read access to data stored in the storage cell.

2. The memory cell of claim 1 further comprising a write bit line connected to the memory cell wherein data is written into the storage cell using the write bit line.

3. The memory cell of claim 2 further comprising a write port device that buffers the storage cell from the write bit line.

4. The memory cell of claim 1 that is capable of performing a selective write operation.

5. The memory cell of claim 1 that is capable of performing one or more of a boolean AND operation, a boolean OR operation, a boolean NAND operation and a boolean NOR operation.

6. The memory cell of claim 1 that is capable of performing a search operation.

7. The memory cell of claim 1, wherein the memory cell is a static random access memory cell.

8. The memory cell of claim 7, wherein the static random access memory cell is one of a two port static random access memory cell, a three port static random access memory cell and a four port static random access memory cell.

* * * * *